United States Patent [19]

Kakumu

[11] Patent Number: 5,654,241
[45] Date of Patent: Aug. 5, 1997

[54] METHOD FOR MANUFACTURING A SEMICONDUCTOR DEVICE HAVING REDUCED RESISTANCE OF DIFFUSION LAYERS AND GATE ELECTRODES

[75] Inventor: Masakazu Kakumu, Yokohama, Japan

[73] Assignee: Kabushiki Kaisha Toshiba, Japan

[21] Appl. No.: 454,647

[22] Filed: Dec. 21, 1989

[30] Foreign Application Priority Data

Dec. 23, 1988 [JP] Japan .................. 63-324925

[51] Int. Cl.$^6$ .................................. H01L 21/441
[52] U.S. Cl. .................. 438/306; 438/232; 438/233; 438/533; 438/659
[58] Field of Search .................. 437/200, 202, 437/201

[56] References Cited

U.S. PATENT DOCUMENTS

| Re. 32,613 | 2/1988 | Lepselter et al. | 437/200 |
|---|---|---|---|
| 4,577,396 | 3/1986 | Yamamoto et al. | 437/200 |
| 4,622,735 | 11/1986 | Shibata | 437/200 |
| 4,677,736 | 7/1987 | Brown | 437/200 |
| 4,731,318 | 3/1988 | Roche et al. | 437/200 |
| 4,816,421 | 3/1989 | Dynes et al. | 437/25 |
| 4,908,334 | 3/1990 | Zuhr et al. | 437/200 |
| 4,912,061 | 3/1990 | Nast | 437/200 |

FOREIGN PATENT DOCUMENTS

| 59-110115 | 6/1984 | Japan . | |
|---|---|---|---|
| 59-181672 | 10/1984 | Japan | 437/200 |
| 60-175456 | 9/1985 | Japan . | |
| 61-114524 | 6/1986 | Japan . | |
| 63-313818 | 12/1988 | Japan | 437/200 |

OTHER PUBLICATIONS

English–language Abstracts corresponding to the documents listed under AS, AT, and AU.

Japanese Search Report 63–324925, published Aug. 10, 1993.

"TiSi$_2$ and TiN Formation By Ti–Ion Implantation and Their Applications to MOS Devices", Y Omura, et al. Extended Abstracts of the 20th Conference on Solid State Devices and Materials, Aug., 1988, pp. 93–96.

*Primary Examiner*—John S. Maples
*Attorney, Agent, or Firm*—Banner & Witcoff, Ltd.

[57] ABSTRACT

In a method for manufacturing a semiconductor device, metal ions are doped into the surface regions of diffusion layers or a diffusion layer forming region, thereby forming metal silicide layers of low resistance on only the diffusion layers. In a further method for manufacturing a semiconductor device, metal ions are doped into the surface regions of diffusion layers or a diffusion layer forming region and the upper surface of a gate electrode. Then, the structure is subjected to a process to make a silicide, thereby forming metal silicide layers of low resistance on only the diffusion layers and the gate electrode.

23 Claims, 7 Drawing Sheets

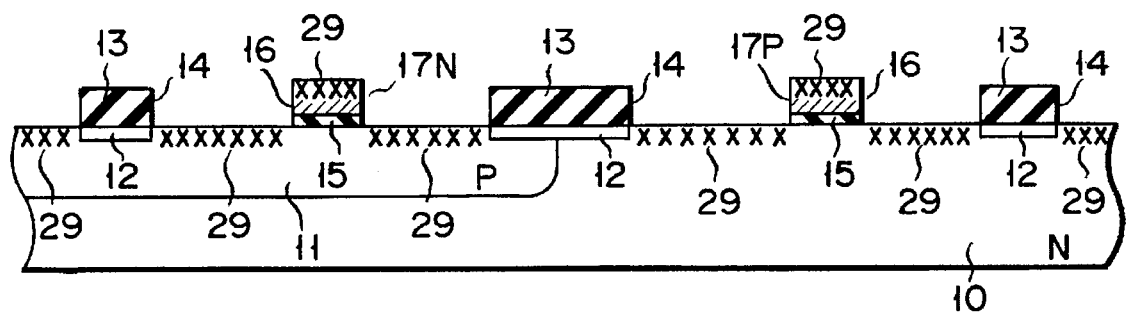
F I G. 3A
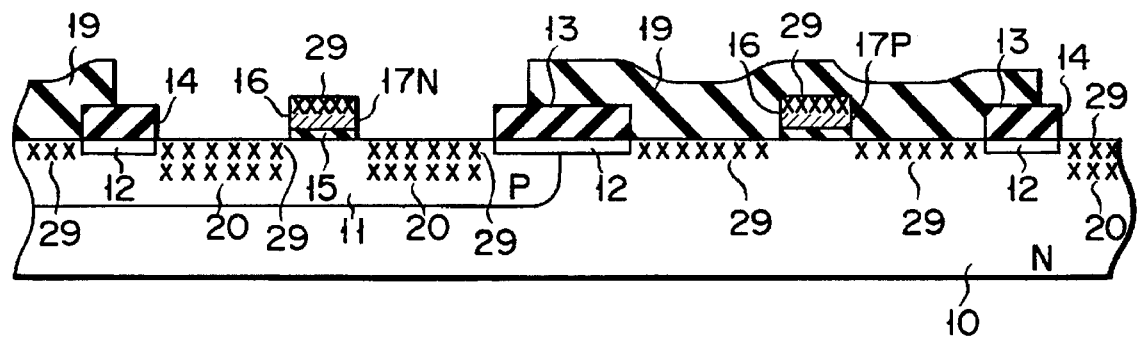
F I G. 3B
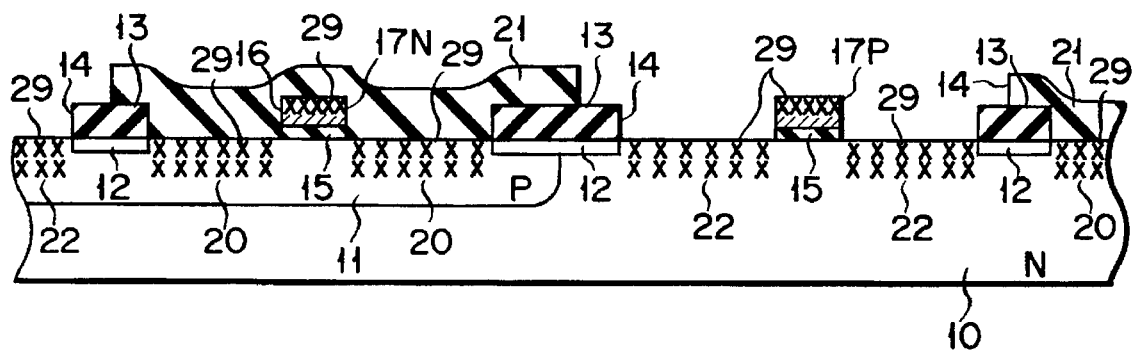
F I G. 3C

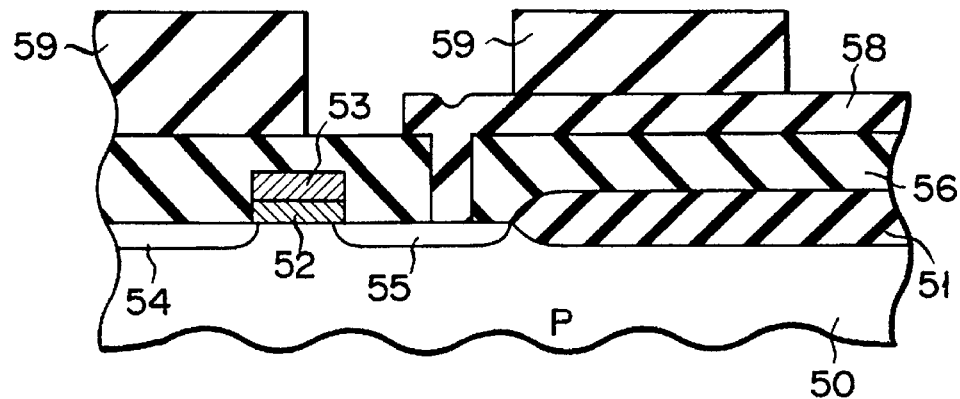
F I G. 5E
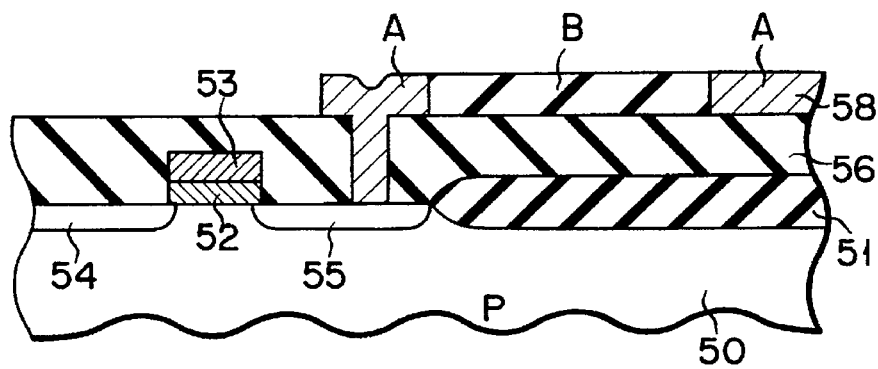
F I G. 5F
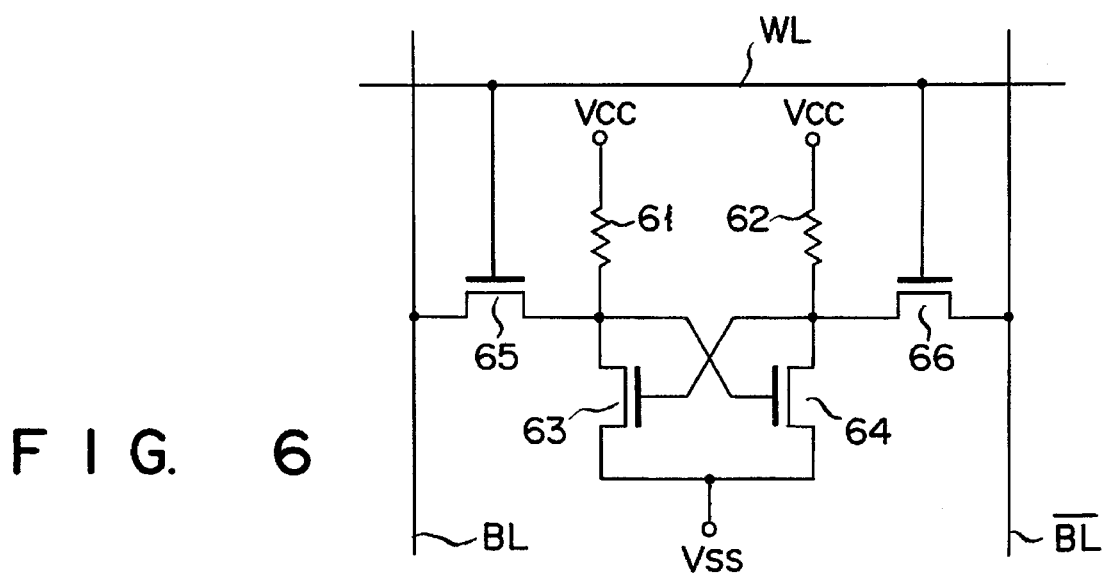
F I G. 6

METHOD FOR MANUFACTURING A SEMICONDUCTOR DEVICE HAVING REDUCED RESISTANCE OF DIFFUSION LAYERS AND GATE ELECTRODES

BACKGROUND OF THE INVENTION

Field of the Invention

The present invention relates to a method for manufacturing a semiconductor device in which the resistance of diffusion layers or diffusion layers and gate electrodes is reduced.

A complementary MOS semiconductor device, for example, a CMOS inverter, is by convention manufactured in the following way. To start, as shown in FIG. 1A, a P well region 31 of 5 μm depth is formed in an N type, [100] silicon substrate 30. Then, element separation impurity layers 32 (impurity layers for preventing the formation of field inversion channels) are formed in the surface regions of the silicon substrate 30. Element separation oxide films 33 (field oxide films), are further formed on the impurity layers 32, respectively. Each paired impurity layer 32 and oxide film 33 serve as a separation region 34. Subsequently, as shown in FIG. 1B, a gate oxide film 35, 100 to 500Å thick, is formed over each element forming region by a thermal oxidation process. An N type polysilicon layer is further deposited over the entire surface of the structure and patterned by photo engraving process (PEP) to form gate electrodes 36. Afterwards, an N type impurity, such as arsenic (As), is selectively ion-implanted into the structure, to form a source 37 and a drain 37 of an N channel MOSFET in the P well region 31, and a potential pick-up region 38 in the silicon substrate 30. Then, a P type impurity, such as boron (B), is selectively ion-implanted into the structure, to form a source 39 and a drain 39 of a P channel MOSFET in the silicon substrate 30, and a potential pick-up region 40 in the P type well region 31. Subsequently, as shown in FIG. 1C, a silicon oxide film 41 for interlayer insulation is deposited over the structure by a CVD (chemical vapor deposition) process, for example. Further, the formed silicon oxide film 41 is opened to form electrode lead-out portions, and wiring patterns 42 made of aluminum, for example, are formed thereon.

The above method for manufacturing a CMOS inverter is a general method for manufacturing complementary MOS semiconductor devices which has been widely employed. Polysilicon, for example, is used as the wiring material for the gate electrodes which allows the sources and the drains to be formed in a self-alignment manner by using a mask of the gate electrodes, and is also stable at high temperature when subjected to heat treatment. The polysilicon, however, has a property that, when it is doped with a high concentration of impurity, its resistivity is reduced by up to $10^{-3}$ ohm·cm. In a device based on microelements, this hinders any improvement of the operation speed.

Further, reduction of the sheet resistance of the source and the drain is up to 50 to 100 ohm/□. In a case where the elements are extremely small and the on-resistance of the transistor is also small, the source and the drain have a large parasitic resistance. Therefore, it is impossible to increase the on-current.

To cope with this, recently, an approach has been proposed in which, to reduce wiring resistance, silicide layers are formed on the sources, drains, and gate electrodes. In this approach, after the sources, drains and gate electrodes are formed in the step of FIG. 1B, a metal film, such as a titanium film, is deposited over the structure. Then, heat treatment is applied to the structure through heat treatment, and the titanium reacts with silicon, to form a titanium silicide layer. The titanium which does not react with the silicon is etched away by chemical treatment. Finally, a titanium silicide of low resistance is formed on only the surfaces of the sources, drains and gate electrodes. This approach is called a salicide (self aligned silicide) method.

In a salicide process, silicides which result from the reaction of metal with silicon on the surfaces of the sources, drains and gate electrodes, grow and, in extreme cases, connect with each other. The silicides thus interconnected are left even after being subjected to the chemical etching process. Further, a natural oxide film exists in the interface between the metal and the silicon, which causes the reaction of the metal with the silicon to be nonuniform and possibly resulting in the source and/or the drain and the substrate to be shorted.

SUMMARY OF THE INVENTION

With a view to overcoming these disadvantages, the object of the present invention is to provide a method for manufacturing a semiconductor device which reduces the contact resistance of the source, drain and gate electrode without any interconnection between any two of the source, drain and gate electrode, and between the source and/or drain and the substrate.

According to the present invention, there is provided a method for manufacturing a semiconductor device comprising the steps of selectively doping metal ions into a silicon substrate of a first conductivity type at an acceleration voltage selected such that a peak impurity concentration is present at a depth within 500Å from the surface of the substrate; subjecting the structure to heat treatment at 500° C. or more in an atmosphere devoid of oxygen, thereby forming a silicide layer in the region doped with metal ions; selectively doping impurities of a second conductivity type, serving as carriers in silicon, into the silicide layer; subjecting the structure to heat treatment at 600° C. or more, thereby forming a diffusion layer located deeper than the silicide layer; and forming a wiring layer on the surface of the silicide layer.

BRIEF DESCRIPTION OF THE DRAWINGS

FIGS. 3A to 3C are sectional views showing a sequence of steps for manufacturing a semiconductor device according to a second embodiment of the present invention;

FIG. 6 shows an equivalent circuit of a semiconductor device manufactured by the manufacturing method according to the fourth embodiment.

DETAILED DESCRIPTION OF THE PREFERRED EMBODIMENTS

The present invention will be described using some preferred embodiments of a method for manufacturing a semiconductor device. FIGS. 2A to 2G are sectional views showing a sequence of steps of a method for manufacturing a semiconductor device which is a first embodiment of the present invention. In this embodiment, the semiconductor is a CMOS inverter.

Figure 1A:
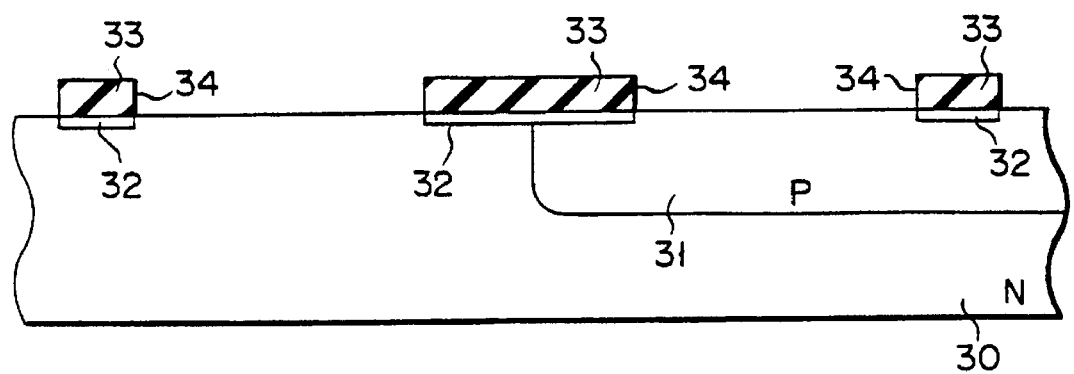
FIGS. 1A to 1C are sectional views showing a sequence of steps for manufacturing a semiconductor device according to a conventional semiconductor manufacturing method.
Figure 1B:
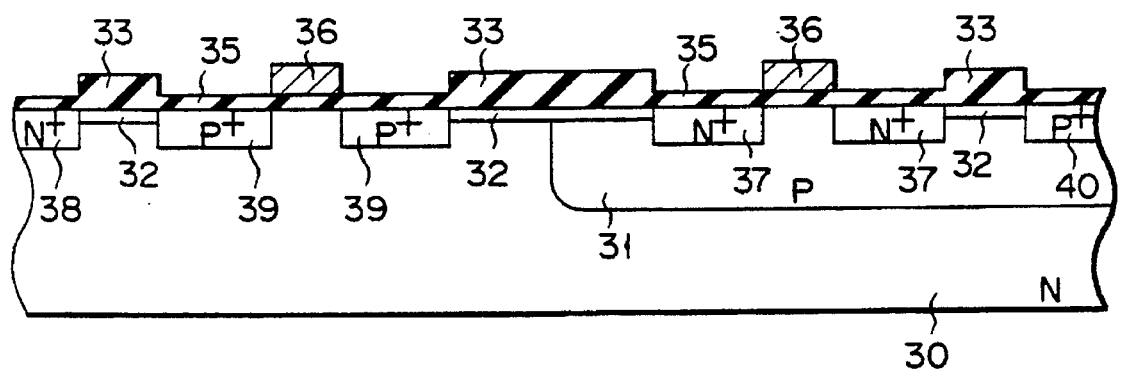
Figure 1C:
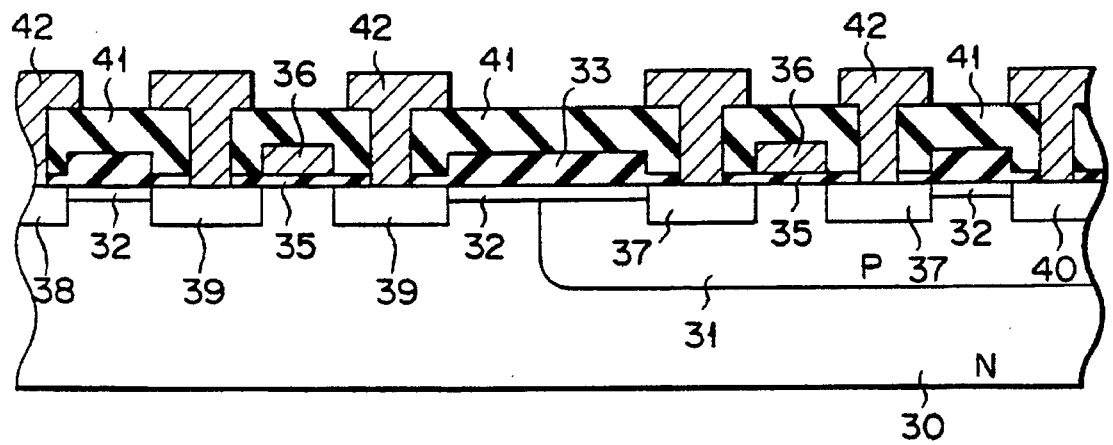
Figure 2A:
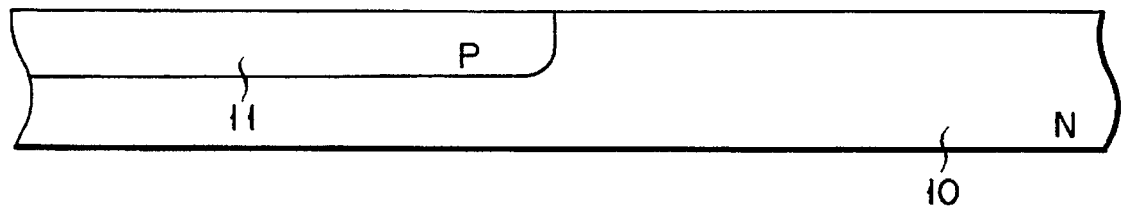
FIGS. 2A to 2G are sectional views showing a sequence of steps for manufacturing a semiconductor device according to a first embodiment of the present invention.

To start, as shown in FIG. 2A, a P well region 11, 3 to 5 mm deep, is formed in an N type, [100] silicon substrate 10, of 1 to 10 ohm·cm in resistivity, is formed in a P well region 11, 3 to 5 μm deep, in the usual manner.

Figure 2B:
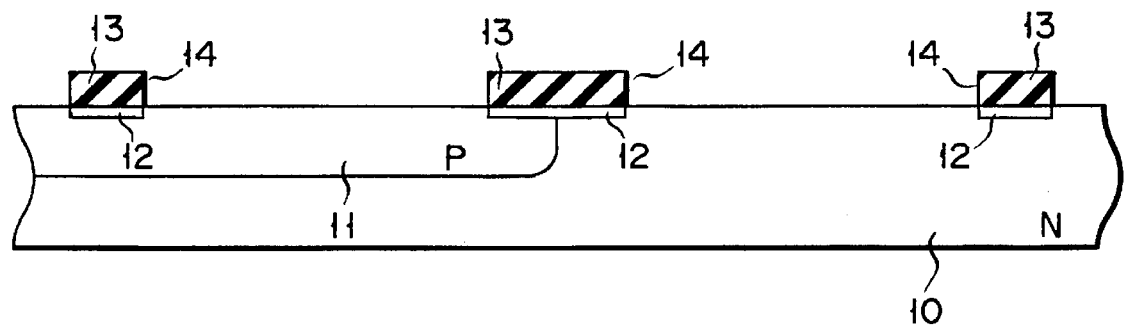

Then, as shown in FIG. 2B, a predetermined impurity is diffused, by an ion implantation process, into the surface portions of the substrate 10, where they serve as element separation regions, thereby forming element-separation impurity layers 12, for field inverting channel prevention purposes. Further, element-separation silicon oxide films 13, of 200 to 500 μm thickness, are formed on the layers 12 by a thermal oxidation process at 1000° C. Each paired impurity layer 12 and oxide film 13 serve as an element separation region 14.

Figure 2C:
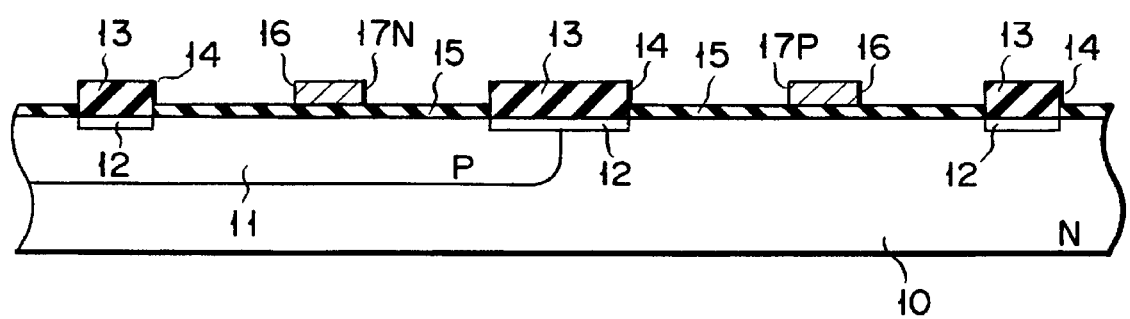

Subsequently, as shown in FIG. 2C, gate oxide films 15, of 70 to 150Å thickness, are formed in element forming regions by a hydrochloric acid oxidation process at 800° to 900° C., for example. Further, a polysilicon layer 16, of 0.3 to 0.6 μm thickness, is deposited over the entire surface of the structure by a CVD process, for example. The formed polysilicon layer 16 is patterned by a photo engraving process, thereby forming MOSFETs.

Figure 2D:
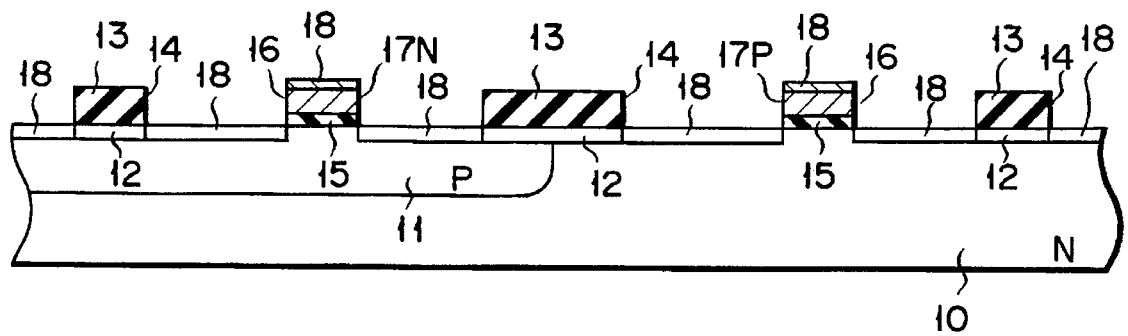

By using the gate electrodes 17N and 17P, and the element-separation regions 14 as a mask, the gate oxide film 15 is etched by using $NH_4F$. Metal, e.g., titanium, is ion-implanted throughout the entire surface of the structure in an accelerating electric field of 50 KeV and at a dosage of $3 \times 10^{17}/cm^2$. The structure thus processed is then subjected to heat treatment at 600° C. in an oxygen-free atmosphere. Under this condition, titanium and silicon react with each other so that, as shown in FIG. 2D, titanium-silicide layers 18 are formed on the portions where drain and source are to be formed, and on the gate electrodes 17N and 17P. In this case, the side walls of the gate electrodes 17N and 17P are not doped with titanium and hence no titanium-silicide layer is formed on the side walls. Therefore, the individual titanium-silicide layers 18 are isolated from each other. If the acceleration voltage for titanium is set at 50 KeV or more, the damage due to the ion implantation penetrates deeply into the substrate. This results in an increase of the junction leak current of the source and the drain to subsequently be formed. On the other hand, when the acceleration voltage is too small, titanium is scattered on the surfaces so that no titanium is ion-implanted into the structure. For this reason, the acceleration voltage for the ion implantation must be carefully selected. That voltage must be set at about 50 KeV so that a peak impurity concentration is present at a depth within 500Å from the surface of the substrate.

Figure 2E:
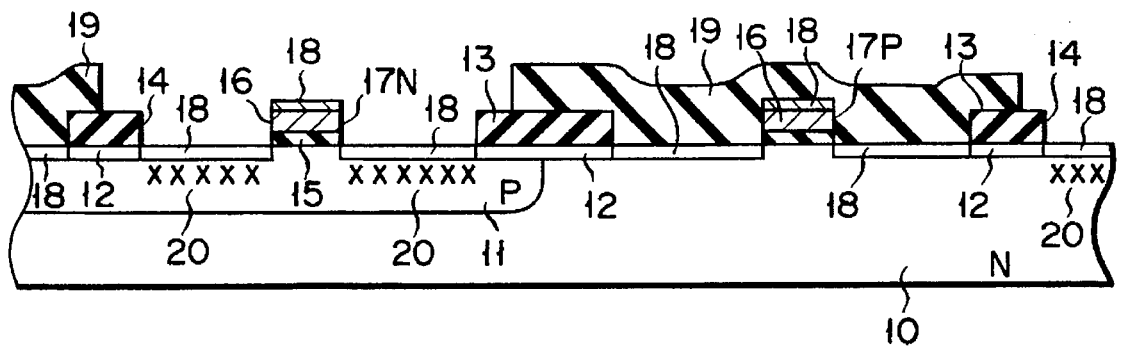

Next, a photo resist film 19 is formed over the entire surface of the structure. As shown in FIG. 2E, the photo resist film 19 is selectively removed to leave a pattern which provides a region where a source and drain are to be formed in later steps, and to allow the gate electrode 17N and the substrate potential pick-up region in the N channel MOSFET to be exposed. Afterwards, with the photo resist film 19 remaining, an N type impurity, e.g., arsenic (As), is ion implanted into the P well region 11 and the substrate 10 in a 40 KeV accelerating electric field and with $3 \times 10^{15}/cm^2$ of dosage. Through the ion implantation, a plurality of N type impurity doped regions 20 are selectively formed.

Figure 2F:
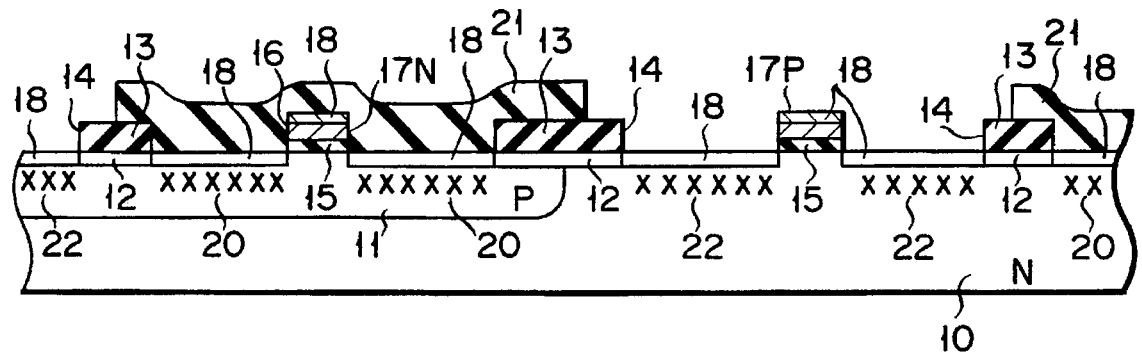

Subsequently, the photo resist film 19 that is used with the ion implantation is completely removed, and another photo resist film 21 is formed over the entire surface of the structure. As shown in FIG. 2F, the photo resist film 21 is selectively removed to leave a pattern which provides a region where a source and drain are to be formed in later steps, and to allow the gate electrode 17P and the P well potential pick-up region in the P channel MOSFET to be exposed. Afterwards, with the photo resist film 21 remaining, a P type impurity, e.g., boron (B), is ion implanted into the substrate 10 and the P well region 11 in a 40 KeV accelerating electric field and with a $3 \times 10^{15}/cm^2$ dosage. Through the ion implantation, a plurality of P type impurity doped regions 22 are selectively formed.

Figure 2G:
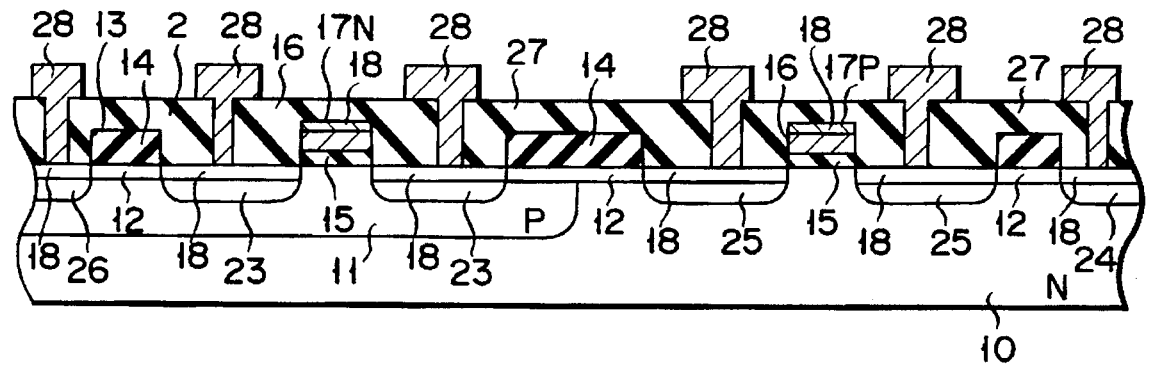

Following the above step, the structure is subjected to heat treatment at 600° to 1000° C. The impurities in the N and P type by heat treatment impurity doped regions 20 and 22 are activated, so that, as shown in FIG. 2G, a source 23 and drain 23, a substrate potential pick-up region 24 in the N channel MOSFET, and a source 25 and drain 25 and a P well potential pick-up region 26 in the P channel MOSFET, which are deeper than the titanium-silicide layer 18, are formed. In this case, the sheet resistance of each titanium-silicide layer 18 is reduced to about 1 ohm/□. Subsequently, an oxide film 27 for interlayer insulation is formed on the entire surface of the structure by a CVD process, for example. The oxide film 27 is opened to form electrode lead-out portions. The surface of the structure thus processed is further coated with wiring metal, e.g., aluminum, and patterned to form a wiring pattern 28. In this way, a CMOS semiconductor device is completed.

In the semiconductor device manufactured by the method as mentioned above, no natural oxide film exists between the titanium-silicide layer and silicon, and between the titanium-silicide layer and the polysilicon. Accordingly, the reaction between the metal and silicon uniformly progresses in the interface therebetween, and the interface continuously changes. Therefore, it is possible to form a low resistance titanium-silicide layer on the surfaces of the source, drain and gate electrodes. Consequently, the contact resistance of the source, drain and gate electrode can be satisfactorily reduced. Further, it is noted that the titanium-silicide layer can be formed in a self alignment manner by applying only the titanium ion implanting step to the conventional method.

While titanium is used as the metal ion implanted in the step of FIG. 2D, it should also be evident that the metal may be any of molybdenum, tungsten, nickel, platinum, palladium, tantalum, and the like.

While arsenic and boron are used as the N and P type impurities ion, respectively, implanted in the steps of FIGS. 2E and 2F, it is evident that the impurities may be any of the metals having a valance of III or V, such as phosphorus, antimony, boron fluoride, and aluminum.

The wiring pattern 28, which is made of aluminum and formed as in the step of FIG. 2G, may be a layered structure of an alloy of aluminum, silicon and copper, an alloy of aluminum and copper, or an alloy of aluminum and another metal.

A second embodiment of a method for manufacturing a semiconductor device according to the present invention will henceforth be described. As recalled, in the first embodiment as mentioned above, the titanium-silicide layer is first formed in a manner wherein titanium ions are implanted, and immediately after the ion implantation, the structure is subjected to heat treatment. After the titanium-silicide layer is formed, the sources and the drains of the N and P channel MOSFETs are formed. In the second embodiment, following the implantation process of titanium ions, ion implantation of N and P type impurities rather than heat treatment, is performed. Then, the structure is treated at 500° C. or more in an oxygen-free atmosphere, whereby the metal silicide layer and the sources and drains of the N and P channel MOSFETs are simultaneously formed.

Also in the second embodiment, by using the gate electrodes 17N and 17P, and the element-separation regions 14 as a mask, the gate oxide film 15 is etched by using $NH_4F$. Metal, e.g., titanium, is ion-implanted into the structure through its entire surface in a 50 KeV accelerating electric field and with $\times 10^{17}/cm^2$ of dosage, as in the step of FIG. 2D. The illustration of FIG. 3A shows the structure with titanium doped regions 29 thus formed. In this second embodiment, no heat treatment follows the above step to form the titanium doped regions. After the titanium doped regions are formed, a photo resist film 19 is formed over the entire surface of the structure. As shown in FIG. 3B, the photo resist film 19 is selectively removed to leave a pattern which provides a region where a source and drain are to be formed in later steps, and to allow the gate electrode 17N and the substrate potential pick-up region in the N channel MOSFET to be exposed. Afterwards, with the photo resist film 19 remaining, an N type impurity, e.g., arsenic (As), is ion implanted into the P well region 11 and the substrate 10 in a 40 KeV accelerating electric field and with $3\times 10^{15}/cm^2$ of dosage. Through this ion implantation, a plurality of N type impurity doped regions 20 are selectively formed.

Subsequently, the photo resist film 19 that is used in the ion implantation is completely removed, and another photo resist film 21 is formed over the entire surface of the structure. As shown in FIG. 3C, the photo resist film 21 is selectively removed to leave a pattern which provides a region where a source and drain are to be formed in later steps, and to allow the gate electrode 17P and the P well potential pick-up region in the P channel MOSFET to be exposed. Afterwards, with the photo resist film 21 remaining, a P type impurity, e.g., boron (B), is ion implanted into the substrate 10 and the P well region 11 in a 40 KeV accelerating electric field and with $3\times 10^{15}/cm^2$ of dosage. Through this ion implantation, a plurality of P type impurity doped regions 22 are selectively formed.

Following the above step, the structure is subjected to heat treatment at 600° to 1000° C. By means of this heat treatment, the impurities in the N and P type impurity doped regions 20 and 22 are activated, and the titanium in each titanium doped region 29 is also activated. As a result, as in the step of FIG. 2G, a source 23 and drain 23, a substrate potential pick-up region 24 in the N channel MOSFET, and a source 25 and drain 25 and a P well potential pick-up region 26 in the P channel MOSFET, are formed. At the same time, titanium-silicide layers 18 are also formed on the sources of the drains 23 and 25, the potential pick-up region 24 and 26, and the gate electrodes 17N and 17P. Subsequently, an oxide film 27 for interlayer insulation is formed on the entire surface of the structure by a CVD process, for example, and the oxide film 27 is opened to form electrode lead-out portions. The surface of the structure thus processed is further coated with wiring metal, e.g., aluminum, and patterned to form a wiring pattern 28. In this way, a CMOS semiconductor device is completed.

A third embodiment of a method for manufacturing a semiconductor device according to the present invention will henceforth be described. As recalled, in the first embodiment as mentioned above, the titanium-silicide layer is first formed in a manner wherein titanium ions are implanted, and immediately after the ion implantation, the structure is subjected to heat treatment. After the titanium-silicide layer is formed, the sources and the drains of the N and P channel MOSFETs are formed. In the third embodiment, the sources and the drains of the N and P channel MOSFETs are formed in a similar manner to that of the first embodiment. After this, titanium ions are implanted, and the structure is treated at 600° C. or more in an oxygen-free atmosphere, to form titanium silicide layers.

Figure 4A:
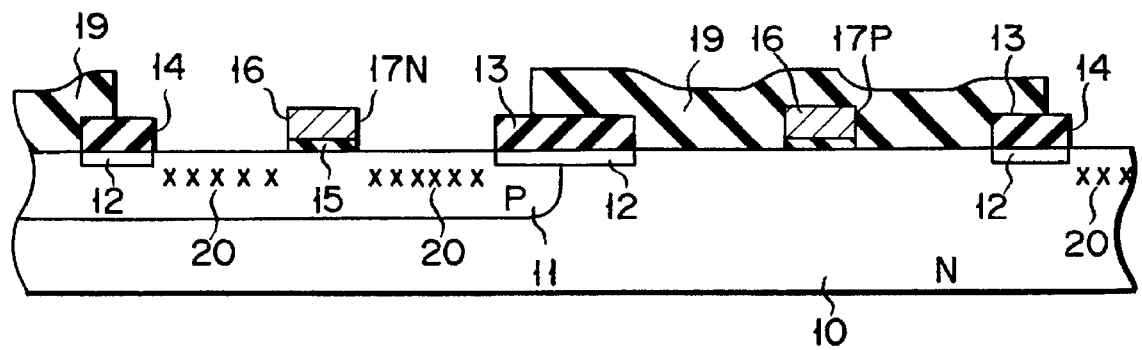
FIGS. 4A to 4C are sectional views showing a sequence of steps for manufacturing a semiconductor device according to a third embodiment of the present invention.

Also in the third embodiment, by using the gate electrodes 17N and 17P, and the element-separation regions 14 as a mask, the gate oxide film 15 is etched by using $NH_4F$, and a photo resist film 19 is formed over the entire surface of the structure, as in the step of FIG. 2D. Then, as shown in FIG. 4A, the photo resist film 19 is selectively removed to leave a pattern which provides a region where a source and drain are to be formed in later steps, and to allow the gate electrode 17N and the substrate potential pick-up region in the N channel MOSFET to be exposed. Afterwards, with the photo resist film 19 remaining, an N type impurity, e.g., arsenic (As), is ion implanted into the P well region 11 and the substrate 10 in a 40 KeV accelerating electric field and with $3\times 10^{15}/cm^2$ of dosage. Through this ion implantation, a plurality of N type impurity doped regions 20 are selectively formed.

Figure 4B:
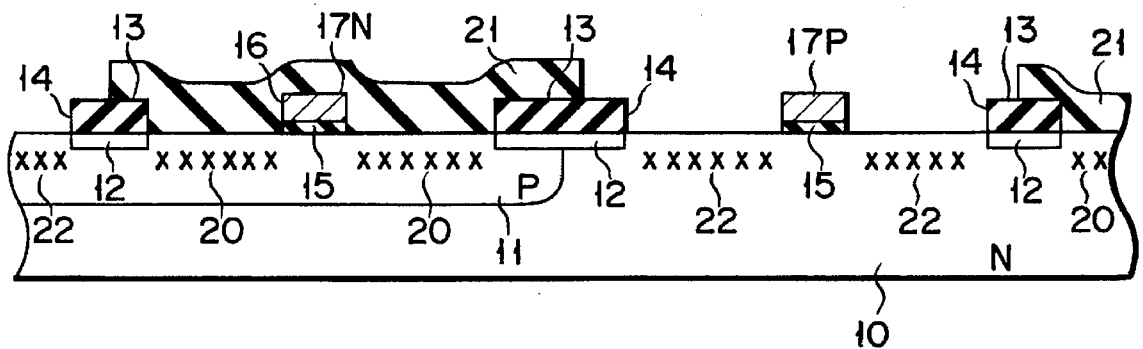

Subsequently, the photo resist film 19 that is used in the ion implantation is completely removed, and another photo resist film 21 is formed over the entire surface of the structure. As shown in FIG. 4B, the photo resist film 21 is selectively removed to leave a pattern which provides a region where a source and drain are to be formed in later steps, and to allow the gate electrode 17P and the P well potential pick-up region in the P channel MOSFET to be exposed. Afterwards, with the photo resist film 21 remaining, a P type impurity, e.g., boron (B), is ion implanted into substrate 10 and the P well region 11 in a 40 KeV of accelerating electric field and with $3\times 10^{15}/cm^2$ of dosage. Through this ion implantation, a plurality of P type impurity doped regions 22 are selectively formed.

Figure 4C:
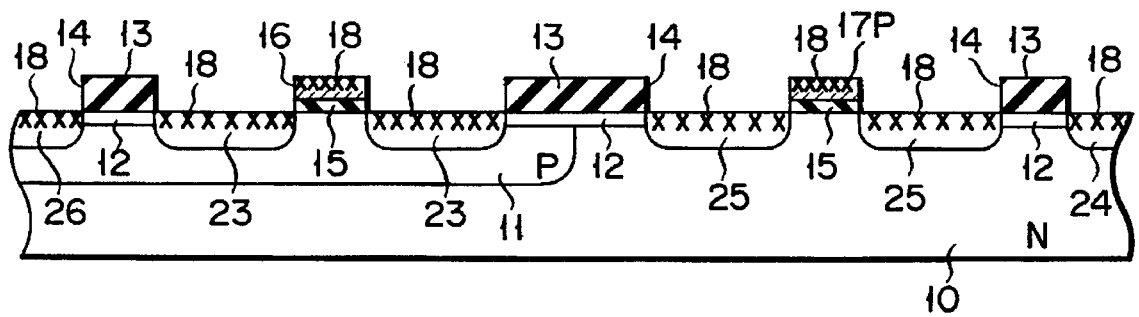

Following the above step, as shown in FIG. 4C the structure is subjected to heat treatment at 600° to 1000° C. By means of this treatment, the impurities in the N and P type impurity doped regions 20 and 22 are activated, thereby forming a source 23 and drain 23, and a substrate potential pick-up region 24 in the N channel MOSFET, and a source 25 and drain 25 and a P well potential pick-up region 26 in the P channel MOSFET.

In the third embodiment, then, titanium is ion implanted into the structure through its entire surface in a 50 KeV accelerating electric field and with $3\times 10^{17}/cm^2$ of dosage, thereby forming titanium dope regions 51 in a plurality of locations. The structure is treated at 600° C. or more in an oxygen-free atmosphere, to form titanium silicide layers 18.

In the above-mentioned second and third embodiments, titanium-silicide layers of low resistance can be formed on the surfaces of the sources, drains, and gate electrodes. Therefore, the wiring resistance of the sources, drains and gate electrodes can be reduced satisfactorily. If required, titanium (Ti) as the metal ion implanted may be replaced by any of molybdenum (Mo), tungsten (W), nickel (Ni), platinum (Pt), palladium (Pd), tantalum (Ta), and the like. The N and P type impurities, ion implanted for forming the sources and drains of the MOSFETs, may be any of arsenic (As), boron (B), phosphorus (P), antimony (Sb), boron fluoride ($BF_2$), and aluminum (Al), and the like. The wiring pattern 28 may be a layered structure of an alloy of aluminum, silicon and copper, an alloy of aluminum and copper, or an alloy of aluminum and another metal.

It should be understood that the present invention is not limited to the specific embodiments as mentioned above, but may variously be changed and modified within the scope of the invention. In the first embodiment, to form the silicide layers, metal is ion implanted into the structure throughout its entire surface. In the case of an SRAM-using a high resistance resistor of a polysilicon layer as a load element, only the polysilicon layer to be used as the high resistance resistor is covered with a photo resist. Metal ion is implanted into the regions other than the high resistance resistor region. In this way, the resistance of the regions other than the high resistance resistor region can be selectively reduced. This will be described as a fourth embodiment of the present invention.

Figure 5A:
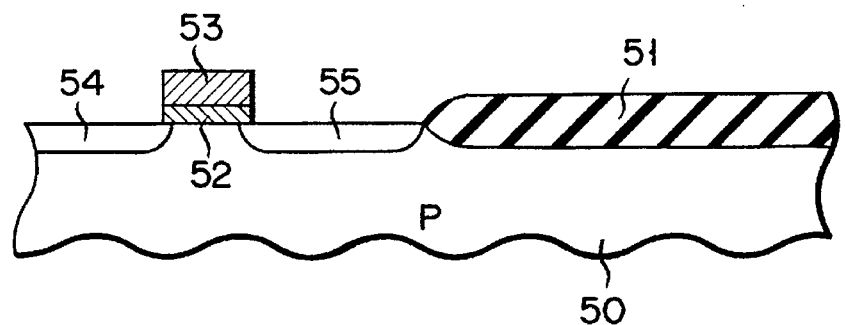
FIGS. 5A to 5P are sectional views showing a sequence of steps for manufacturing a semiconductor device according to a fourth embodiment of the present invention.

As shown in FIG. 5A, an element separation oxide film 51 of 200 to 500 nm thick is formed in a P type, [100] silicon on substrate 50 by a thermal oxidation process at 500° C. Then gate oxide films 52 of 70 to 150Å thickness are formed by a hydrochloric acid oxidation process at 800° to 900° C., for example. Further, a polysilicon layer of 0.4 μm thick is deposited to cover the entire surface of the structure by a CVD process, for example. The formed polysilicon layer is pattern by a photo engraving process, to form thereby a gate electrode 53. Thereafter, by using the oxide film 51 and the the gate electrode 53 as a mask, arsenic is ion-implanted into the structure throughout its entire surface in a 40 KeV accelerating electric field and with $3 \times 10^{15}/cm^2$ of dosage, thereby forming a source 54 and a drain 55 of an N channel MOS transistor.

Figure 5B:
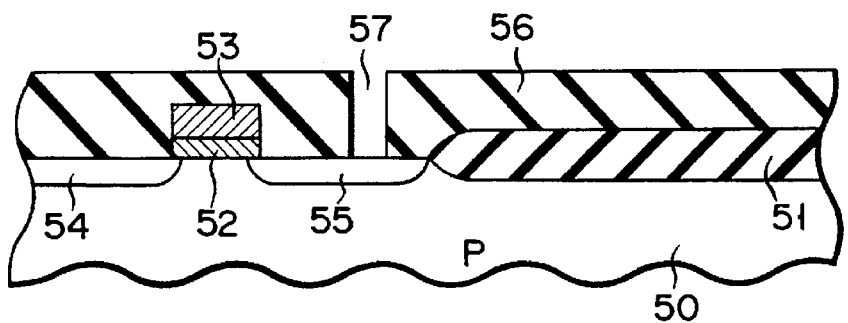

In the step shown in FIG. 5B, a silicon oxide film 56 of 0.3 μm for interlayer insulation is formed on the entire surface of the structure by a CVD process. The silicon oxide film 56 is holed to form a contact hole 57 at a location where the MOS transistor is connected to the high resistance resistor in later steps.

Figure 5C:
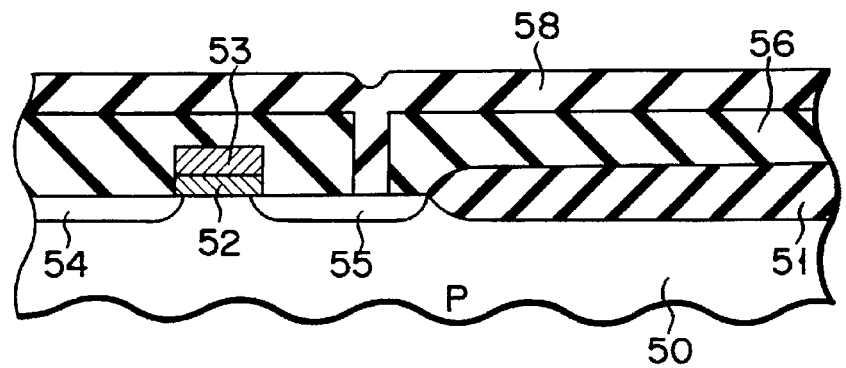

In the step of FIG. 5C, a polysilicon layer 58 of 500 to 700Å, which is to be used as the high resistance resistor and a power source wiring layer, is formed over the entire surface of the structure by a CVD process.

Figure 5D:
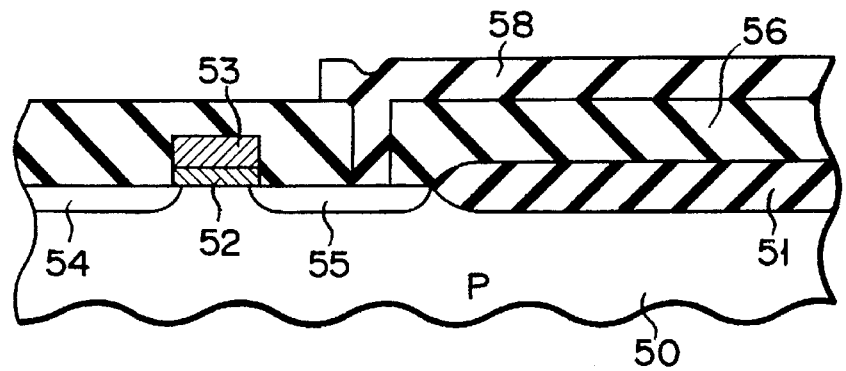

In the step of FIG. 5D, the polysilicon layer 58 is patterned. A portion of the patterned polysilicon layer 58, other than the portion whose resistance is to be reduced, is covered with a photo resistor 59, as shown in FIG. 5E. With the photo resist 59 as a mask, arsenic is ion-implanted into the structure through its entire surface in a 30 KeV accelerating electric field and with $1 \times 10^{15}/cm^2$ of dosage, and titanium is ion-implanted into the structure throughout its entire surface in a 50 KeV accelerating electric field and with $1 \times 10^{17}/cm^2$ of dosage.

Then the structure is treated at 500° to 600° C. or more in an oxygen-free atmosphere. As a result, in each region A doped with arsenic and titanium ions in the polysilicon layer 58, arsenic is activated, titanium silicide layers are formed on the surfaces of the respective regions, and the resistance is reduced to approximately 5 to 10 ohm/□. In the region B not doped with the ions, the polysilicon remains intact and exhibits high resistance of 1 to 10 T ohm/□.

FIG. 6 shows an equivalent circuit of a memory cell portion of the SRAM thus manufactured. As shown, the memory cell is made up of high resistance resistors 61 and 62 serving as load elements, N channel MOS transistors 63 and 64, as drive transistors, the gates of which are coupled with a word line WL, and N channel MOS transistors 65 and 66, as transfer gates, which are coupled at the first ends with paired bit lines BL and BL bar. The high resistance regions B in FIG. 5F are used as the high resistance resistors 61 and 62.

As seen from the foregoing description, the present invention has successfully provided a method for manufacturing a semiconductor device which reduces the contact resistance of the source, drain or the gate electrode without any interconnection between any two of the source, drain and gate electrode and between the source and/or drain and the substrate.

What is claimed is:

1. A method for manufacturing a semiconductor device comprising the steps of:

doping metal ions into a selected region in a silicon substrate having a first conductivity type so that a peak metal ion impurity concentration is present at a depth less than 500 Angstroms from the surface of said substrate;

heat treating the metal ion doped substrate at 500° C. or more in an oxygen-free atmosphere, thereby forming a silicide layer in the selected region doped with said metal ions;

doping an impurity having a second conductivity type into said silicide layer formed in the selected region; and heat treating the substrate at 600° C. or more, thereby forming a diffusion layer of the impurity having the second conductivity type which extends to a depth from the surface of the substrate greater than the depth of said silicide layer.

2. The method according to claim 1, wherein said metal ions used for forming said ion doped regions are metal ions selected from the group consisting of molybdenum, tungsten, nickel, platinum, palladium, and tantalum.

3. The method according to claim 1, wherein said metal ions used for forming said selected region doped with metal ions are implanted with an acceleration voltage of about 50 KeV.

4. A method for manufacturing a semiconductor device comprising the steps of:

forming at least one element separation region on a silicon substrate having a first conductivity type;

forming at least one MOSFET gate electrode on said substrate;

doping metal ions into said substrate at a selected region using the at least one element separation region and the at least one gate electrode as a mask and doping metal ions into said at least one gate electrode so a peak metal ion impurity concentration is present at a depth less than 500 Angstroms from the surface of said substrate and the surface of said gate electrode;

heat treating the metal ion doped substrate and the at least one gate electrode at 500° C. or more in an oxygen-free atmosphere, thereby forming a silicide layer in the selected region doped in the substrate and in the at least one gate electrode;

doping an impurity having a second conductivity type into the silicide layer of the selected region using the at least one element separation region and the at least one gate electrode as a mask;

heat treating the substrate and the at least one gate electrode at 600° C. or more thereby forming at least one diffusion layer of the impurity having a second conductivity type within the selected region, which extends to a depth from the surface of the substrate greater than the depth of said silicide layer; and forming at least one wiring layer on the surface of said silicide layer.

5. The method according to claim 4, wherein said metal ions used in said metal ion doping steps are metal ions selected from the group consisting of molybdenum, tungsten, nickel, platinum, palladium, and tantalum.

6. The method according to claim 4, wherein said metal ions used for forming said selected region doped with metal ions are implanted with an acceleration voltage of about 50 KeV.

7. The method according to claim 4, wherein the silicide layer formed in the selected region and in the at least one gate electrode has a sheet resistance of about 1 Ohm/.

8. A method for manufacturing a semiconductor device comprising the steps of:

doping metal ions into a selected region in a silicon substrate having a first conductivity type so that a peak metal ion impurity concentration is present at a depth less than 500 Angstroms from the surface of said substrate;

doping an impurity having a second conductivity type into the selected region doped with said metal ions;

heat treating the substrate at 500° C. or more in an oxygen-free atmosphere, thereby forming a silicide layer in the selected region doped with said metal ions, and forming a diffusion layer of said impurity having the second conductivity type which extends to a depth from the surface of the substrate greater than the depth of said silicide layer; and forming a wiring layer on said silicide layer.

9. The method according to claim 8, wherein said metal ions used in said metal ion doping steps are metal ions selected from the group consisting of molybdenum, tungsten, nickel, platinum, palladium, and tantalum.

10. The method according to claim 8, wherein said metal ions used for forming said selected region doped with metal ions are implanted with an acceleration voltage of about 50 KeV.

11. A method for manufacturing a semiconductor device comprising the steps of:

forming at least one element separation region on a silicon substrate having a first conductivity type;

forming at least one MOSFET gate electrode on said substrate;

using said at least one element separation region and said at least one gate electrode as a mask for doping metal ions into a selected region in said substrate and doping metal ions into said at least one gate electrode so the peak metal ion impurity concentration is present at a depth less than 500 Angstroms from the surface of said substrate;

doping an impurity having a second conductivity type into the metal ion doped selected region of said substrate using the at least one element separation region and the at least one gate electrode as a mask;

heat treating the substrate at 500° C. or more in an oxygen-free atmosphere, thereby forming a silicide layer in the selected region doped with said metal ions, and forming at least one diffusion layer of the impurity having the second conductivity type within the selected region, which extends to a depth from the surface of the substrate greater than the depth of said silicide layer; and forming a wiring layer on the surface of said silicide layer formed in the selected region.

12. The method according to claim 11, wherein said metal ions used in said metal ion doping steps are metal ions selected from the group consisting of molybdenum, tungsten, nickel, platinum, palladium, and tantalum.

13. The method according to claim 11, wherein said metal ions used for forming said selected region doped with metal ions are implanted with an acceleration voltage of about 50 KeV.

14. The method according to claim 11, wherein the silicide layer formed in the selected region and in the at least one gate electrode has a sheet resistance of about 1 Ohm/.

15. A method for manufacturing a semiconductor device comprising the steps of:

diffusing an impurity having a first conductivity type into a selected first region in a silicon substrate having a second conductivity type, thereby forming at least one diffusion layer of the first conductivity type;

doping metal ions into a selected second region in said at least one diffusion layer so that the peak concentration of the metal ions is present at a depth less than 500 Angstroms from the surface of said substrate; and heat treating the substrate at 600° C. or more in an oxygen-free atmosphere, thereby forming a silicide layer in the selected second region doped with said metal ions, which extends to a depth from the surface of the substrate less than the depth of said at least one diffusion layer.

16. The method according to claim 15, wherein said metal ions used in said metal ion doping steps are metal ions selected from the group consisting of molybdenum, tungsten, nickel, platinum, palladium, and tantalum.

17. The method according to claim 15, wherein said metal ions used for forming said selected second region doped with metal ions are implanted with an acceleration voltage of about 50 KeV.

18. A method for manufacturing a semiconductor device comprising the steps of:

forming at least one element separation region on a silicon substrate, the substrate having a first conductivity type;

forming at least one gate electrode of a MOSFET on said substrate;

using said at least one element separation region and said at least one gate electrode as a mask, doping an impurity having a second conductivity type into a selected first region in said substrate, thereby forming at least one diffusion layer;

doping metal ions into a selected second region using the at least one element separation region and the at least one gate electrode as a mask, the selected second region being within said at least one diffusion layer, and doping metal ions into the at least one gate electrode so that the peak impurity concentration of the metal ions is present at a depth less than 500 Angstroms from the surface of said substrate; and heat treating the substrate at 600° C. or more in an oxygen-free atmosphere, thereby forming a silicide layer from the selected second region doped with said metal ions which is located at a depth from the surface of the substrate less than the depth of said at least one diffusion layer, and forming a silicide layer in said at least one gate electrode.

19. The method according to claim 18, wherein said metal ions used in said metal ion doping steps are metal ions selected from the group consisting of molybdenum, tungsten, nickel, platinum, palladium, and tantalum.

20. The method according to claim 18, wherein said metal ions used for forming said selected second region doped with metal ions are implanted with an acceleration voltage of about 50 KeV.

21. The method according to claim 18, wherein the silicide layer formed in the selected second region and in the at least one gate electrode has a sheet resistance of about 1 Ohm/.

22. A method of manufacturing a semiconductor device, the method comprising the steps of:
- preparing a silicon semiconductor body of a first conductivity type;
- selectively doping metal ions into selected regions of said semiconductor body;
- heat treating the metal doped substrate to form silicide layers in said selected regions;
- selectively doping an impurity of a second conductivity type into said silicide layers; and
- heat treating the second impurity doped substrate at 500° C. or more in an oxygen-free atmosphere to form diffusion layers of the impurity of the second conductivity type.

23. A method of manufacturing a semiconductor device, the method comprising the steps of:
- preparing a silicon semiconductor body of a first conductivity type;
- forming element separation regions in the semiconductor body;
- forming gate electrodes on said semiconductor body;
- selectively doping metal ions into selected regions of said semiconductor body and into said gate electrodes;
- heat treating the metal doped semiconductor body to form silicide layers in said selected regions and said gate electrodes;
- selectively doping an impurity of a second conductivity type into the silicide layers in said selected regions;
- heat treating the second impurity of the second conductivity doped semiconductor body at 500° C. or more in an oxygen free atmosphere to form source and drain diffusion layers having the second conductivity type; and
- forming a wiring layer in contact with the silicide layers in said selected regions.

* * * * *